US010096747B2

(12) United States Patent
Abe et al.

(10) Patent No.: US 10,096,747 B2
(45) Date of Patent: Oct. 9, 2018

(54) LUMEN MAINTENANCE FACTOR DETERIORATION SUPPRESSING LED MODULE

(71) Applicant: PANASONIC INTELLECTUAL PROPERTY MANAGEMENT CO., LTD., Osaka (JP)

(72) Inventors: Masumi Abe, Osaka (JP); Naoki Tagami, Osaka (JP); Toshiaki Kurachi, Kyoto (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/454,310

(22) Filed: Mar. 9, 2017

(65) Prior Publication Data

US 2017/0263823 A1    Sep. 14, 2017

(30) Foreign Application Priority Data

Mar. 10, 2016  (JP) ................................ 2016-047539

(51) Int. Cl.
*H01L 33/48* (2010.01)
*H01L 33/50* (2010.01)
(Continued)

(52) U.S. Cl.
CPC .......... *H01L 33/486* (2013.01); *H01L 33/502* (2013.01); *H01L 33/56* (2013.01); *H01L 33/60* (2013.01); *H01L 33/62* (2013.01)

(58) Field of Classification Search
CPC ..... H01L 33/60; H01L 33/56; H01L 23/3107; H01L 23/3114; H01L 23/3121;
(Continued)

(56) References Cited

U.S. PATENT DOCUMENTS 8,916,903 B2 * 12/2014 Yamada ................ H01L 33/483
257/100
9,525,114 B2 * 12/2016 Higashiuchi ............ H01L 33/60
(Continued)

FOREIGN PATENT DOCUMENTS

JP    2007-324205    12/2007
JP    2011-14695    1/2011
(Continued)

OTHER PUBLICATIONS

U.S. Appl. No. 15/454,256 to Masumi Abe et al., filed Mar. 9, 2017.

*Primary Examiner* — Scott B Geyer
(74) *Attorney, Agent, or Firm* — Greenblum & Bernstein, P.L.C.

(57) ABSTRACT

A light-emitting diode (LED) module is provided. The LED module includes a substrate, a metal layer disposed above the substrate, a resist layer disposed above the substrate and including a plurality of layers, an LED chip mounted above the substrate, and a wire connecting the metal layer and the LED chip. In a first region in which the LED chip is mounted, at least a portion of the resist layer is disposed directly on the substrate with the LED chip being mounted above the resist layer via an adhesive. In a second region which includes a connection at which the wire and the metal layer are connected and a periphery of the connection, the metal layer is disposed above the substrate with the resist layer being disposed above the metal layer.

19 Claims, 3 Drawing Sheets

(51) Int. Cl.
*H01L 33/56* (2010.01)
*H01L 33/62* (2010.01)
*H01L 33/60* (2010.01)

(58) Field of Classification Search
CPC ...... H01L 33/62; H01L 23/48–23/5389; H01L 33/486; H01L 33/505; H01L 33/507; H01L 33/508
See application file for complete search history.

(56) References Cited

U.S. PATENT DOCUMENTS

| | | | |
|---|---|---|---|
| 10,014,458 B2* | 7/2018 | Abe | H01L 25/0753 |
| 2009/0141492 A1 | 6/2009 | Fujino et al. | |
| 2010/0163914 A1* | 7/2010 | Urano | H01L 33/507 |
| | | | 257/98 |
| 2011/0001156 A1 | 1/2011 | Matsuda et al. | |
| 2015/0077982 A1* | 3/2015 | Urano | H01L 33/58 |
| | | | 362/217.14 |
| 2015/0325761 A1* | 11/2015 | Imai | H01L 33/60 |
| | | | 257/98 |
| 2017/0040497 A1* | 2/2017 | Tagami | H01L 33/486 |
| 2017/0040508 A1* | 2/2017 | Tagami | H01L 33/62 |
| 2017/0040510 A1* | 2/2017 | Tagami | H01L 33/56 |

FOREIGN PATENT DOCUMENTS

| | | |
|---|---|---|
| JP | 2011-176017 | 9/2011 |
| JP | 2014-187081 | 10/2014 |
| WO | 2007/086229 | 8/2007 |

\* cited by examiner

LUMEN MAINTENANCE FACTOR DETERIORATION SUPPRESSING LED MODULE

CROSS REFERENCE TO RELATED APPLICATION

This application claims the benefit of priority of Japanese Patent Application Number 2016-047539 filed on Mar. 10, 2016, the entire content of which is hereby incorporated by reference.

BACKGROUND

1. Technical Field

The present disclosure relates to a light-emitting diode (LED) module including LEDs.

2. Description of the Related Art

Semiconductor light-emitting elements such as LEDs are highly efficient and have a long lifespan, and are thus widely used as light sources of various devices. For example, LEDs are used as illumination light sources of lamps, lighting devices, etc., and as backlight light sources of liquid-crystal devices.

Generally, LEDs are built into various devices by being unitized as an LED module. An LED module includes, for example, a board and at least one LED mounted on the board (for example, see Patent Literature 1 (PTL 1): Japanese Unexamined Patent Application Publication No. 2011-176017).

SUMMARY

As an LED module, for example, the chip on board (COB) configuration in which one or a plurality of LEDs (LED chip(s)) is directly mounted on a board is known. In a COB LED module, a resin board, for example, is used as a board. The resin board includes a resin substrate as a base, a metal layer formed above the resin substrate, and a resist layer formed above the metal layer. The resist layer comprises, for example, a resin material.

An LED module using such a board is problematic in that moisture or gas that has passed through the resist layer causes the metal layer, which is the underlying layer of the resist layer, to degenerate.

When the metal layer degenerates, the reflectivity of the board deteriorates, and the lumen maintenance factor of the LED module deteriorates. In particular, when the resist layer is formed using an epoxy acrylic-based resin material, degeneration of the metal layer becomes prominent because moisture or gas easily passes through the epoxy acrylic-based resin material. Therefore, the lumen maintenance factor of the LED module deteriorates significantly.

In view of this, it is also possible to use a fluorine-based material having a high gas barrier property as a resist layer (resist material). However, since a fluorine-based resist material has a special material composition and there is a small number of suppliers supplying fluorine-based resist materials, continued material supply may become difficult. As such, using a fluorine-based material as a resist material is not practical.

The present disclosure provides an LED module capable of suppressing lumen maintenance factor deterioration.

An LED module according to an aspect of the present disclosure includes: a substrate; a metal layer disposed above the substrate; a resist layer disposed above the substrate and including a plurality of layers; an LED chip mounted above the substrate; and a wire connecting the metal layer and the LED chip, wherein, in a first region in which the LED chip is mounted, at least a portion of the resist layer is disposed directly on the substrate, and the LED chip is mounted above the resist layer via an adhesive, and in a second region which includes a connection at which the wire and the metal layer are connected and a periphery of the connection, the metal layer is disposed above the substrate, and the resist layer is disposed above the metal layer.

An LED module capable of suppressing lumen maintenance factor deterioration can be realized.

BRIEF DESCRIPTION OF DRAWINGS

The figures depict one or more implementations in accordance with the present teaching, by way of examples only, not by way of limitations. In the figures, like reference numerals refer to the same or similar elements.

DETAILED DESCRIPTION OF THE EMBODIMENT

An exemplary embodiment of the present disclosure is described below. It should be noted that the subsequently-described exemplary embodiment shows a specific example. The numerical values, shapes, materials, structural components, the placement and connection of the structural components, etc. shown in the following embodiment are mere examples, and are not intended to limit the scope of the present disclosure. Furthermore, among the structural components in the following exemplary embodiment, components not recited in any one of the independent claims which indicate the broadest concepts of the present disclosure are described as arbitrary structural components.

The respective figures are schematic diagrams and are not necessarily precise illustrations. Therefore, for example, the scales, etc. in the respective figures are not necessarily uniform. Furthermore, in the respective figures, substantially identical components are assigned the same reference signs, and overlapping description is omitted or simplified.

In this Specification, "a plan view" refers to a plan view of LED module 1 or board 10 (resin substrate 11), and refers to when LED module 1 or board 10 (resin substrate 11) are viewed from above. Furthermore, in this Specification, "section view" refers to a section view of LED module 1 or board 10 (resin substrate 11), and refers to when LED module 1 or board 10 (resin substrate 11) is cut in the thickness direction and viewed from the side.

Embodiment

Figure 1:
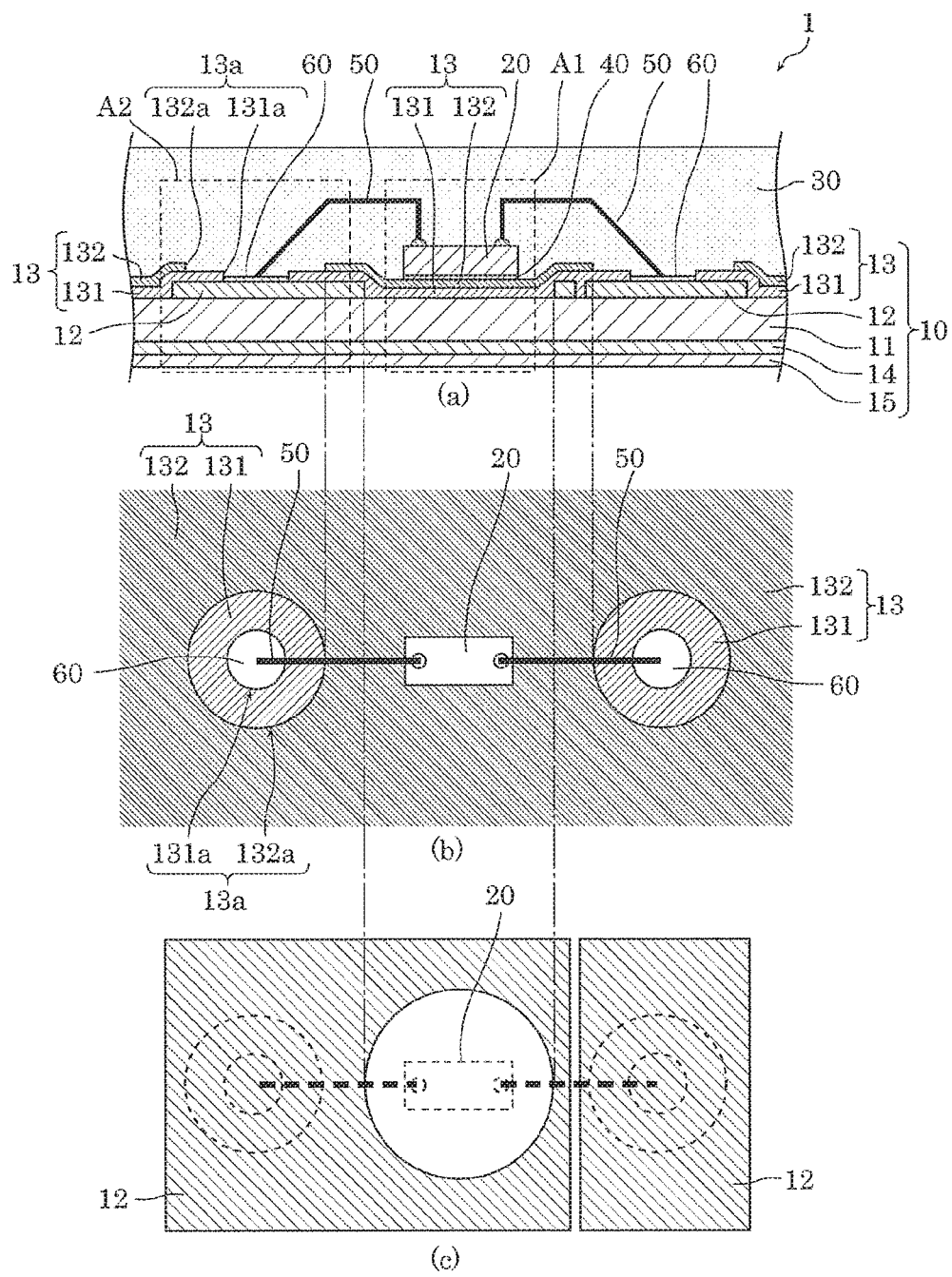
FIG. 1 is a diagram illustrating a configuration of an LED module according to an embodiment.

The configuration of LED module 1 according to an embodiment will be described using FIG. 1. FIG. 1 is a diagram illustrating the configuration of LED module 1 according to the embodiment. In FIG. 1, (a) is an enlarged partial cross-sectional view of LED module 1, and (b) is a plan view of LED module 1 in (a). Furthermore, (c) in FIG. 1 is a diagram illustrating the plan view shape of metal layer 12 of LED module 1 in (a). It should be noted that in (b) in FIG. 1, hatching is applied for the sake of convenience in order to facilitate recognition of the patterns of first layer 131 and second layer 132 of resist layer 13. Likewise, in (c) in FIG. 1, hatching is applied for the sake of convenience in order to facilitate recognition of metal layer 12.

As illustrated in (a) in FIG. 1, LED module 1 includes board 10, LED chip 20 placed on board 10, and sealant 30 which seals LED chip 20. LED module 1 according to this embodiment is a COB light-emitting module in which LED chip 20 is directly mounted on board 10, and emits white light for example.

Hereinafter, the respective components of LED module 1 will be described in detail.

[Board]

Board 10 is a mounting board for the mounting of LED chip 20. Board 10 is a resin board having resin substrate 11 as a base, and, in this embodiment, includes resin substrate 11, metal layer 12 formed above resin substrate 11, and resist layer 13 formed above resin substrate 11. Board 10 according to this embodiment further includes metal layer 13 formed below resin substrate 11, and resist layer 15 formed below resin substrate 11.

It should be noted that board 10 may include resin substrate 11, metal layer 12, and resist layer 13; or board 10 may include resin substrate 11, metal layers 12 and 14, and resist layers 13 and 15; or board 10 may include resin substrate 11 and metal layers 12 and 14; or board 10 may include only resin substrate 11.

For resin substrate 11, it is possible to use, for example, a glass epoxy substrate (FR-4) or a glass composite substrate (CEM-3) composed of glass fibers and an epoxy resin; or a phenolic paper substrate (FR-1, FR-2) composed of craft paper, etc., and phenolic resin; a paper epoxy substrate composed of paper and epoxy resin; or a flexible substrate comprising polyimide, etc., and having flexibility. The thickness of resin substrate 11 is, for example, 1 mm.

Metal layer 12 is a first metal layer formed on the top surface-side of resin substrate 11. Specifically, metal layer 12 is a metal wire formed in a predetermined pattern on one of the surfaces (the top surface) of resin substrate 11, and is electrically connected to LED chip 20. In other words, metal layer 12 is a wire for electrically connecting LED chips 20 with each other, and electrically connecting a connection terminal and LED chip 20. A current for causing LED chip 20 to emit light flows through metal layer 12. Metal layer 12 may be formed in a predetermined pattern by printing, etc., or may be formed in a predetermined shape by etching part of a metal film (for example, copper foil) formed on the entirety of resin substrate 11.

On the other hand, metal layer 14 is a second metal layer formed on the bottom surface-side of resin substrate 11. Specifically, metal layer 14 is formed on the other surface (bottom surface) of resin substrate 11. Metal layer 14 is formed almost on the entirety of the bottom surface of resin substrate 11. Metal layer 14 functions as a heat-dissipater for dissipating heat generated by LED chip 20, and comes into contact with a heat sink, such as a mounting base, when LED module 1 is incorporated into a luminaire, etc. In this embodiment, metal layer 14 is not electrically connected with LED chip 20, and current for causing LED chip 20 to emit light does not flow through metal layer 14.

Metal layers 12 and 14 may be formed using the same metal material, or may be formed different metal materials. In this embodiment, metal layers 12 and 14 are both copper layers (copper foil) comprising copper (Cu). It should be noted that the material of metal layers 12 and 14 is not limited to copper, and a metal material other than copper may be used.

Furthermore, the thickness of metal layers 12 and 14 may be the same or different. In this embodiment, the thickness of metal layers 12 and 14 is the same, and is, for example, 35 μm.

Resist layer 13 is a first resist layer formed on the top surface-side of resin substrate 11, and is formed above metal layer 12. Specifically, resist layer 13 is formed on the entirety of the top surface-side of resin substrate 11 to cover metal layer 12. Resist layer 13 includes a plurality of layers, and is a stacked structure of a plurality of resist films. In this embodiment, resist layer 13 includes the two layers composed of first layer 131 (first resist film) which is the bottom-most layer, and second layer 132 (second resist film) which is the top-most layer.

First layer 131 and second layer 132 are insulating films comprising a resin material having an insulating property, and comprises, for example, an epoxy acrylic-based or silicon-based resin material. In this embodiment, first layer 131 and second layer 132 both comprise a resin material that is epoxy acrylic-based, etc.

In this manner, by covering metal layer 12 using resist layer 13 having an insulating property, the withstand voltage of board 10 can be improved and metal layer 12 can be protected. Specifically, resist layer 13 can suppress deterioration of metal layer 12 such as when metal layer 12 oxidizes, etc.

In addition, in this embodiment, resist layer 13 (first layer 131, second layer 132) is a light-reflecting film having a light-reflecting property. Accordingly, when light emitted by LED chip 20 returns to board 10, the light can be reflected by resist layer 13. Specifically, first layer 131 and second layer 132 are white resists having high reflectivity. A white resist can be configured using a white resin material comprising a resin material containing a white pigment (titanium oxide, silica, etc.). In this manner, by using white resists for first layer 131 and second layer 132, the light extraction efficiency of LED module 1 can be improved.

The thickness of first layer 131 and second layer 132 may be the same or may be different. In this embodiment, the thickness of first layer 131 and second layer 132 is the same, and is, for example, 20 μm. It should be noted that, when the thickness of first layer 131 and second layer 132 are different, it is better that the thickness of second layer 132 be greater than the thickness of first layer 131.

Resist layer 15 is a second resist layer formed on the bottom surface-side of resin substrate 11, and is formed below metal layer 14. Specifically, resist layer 15 is formed on the entirety of the bottom surface-side of resin substrate 11 to cover metal layer 14. In this manner, by forming resist layer 15 to cover metal layer 14, metal layer 14 can be protected. For the material of resist layer 15, it is possible to use the same material as in resist layer 13. Furthermore, although resist layer 15 is a single layer, resist layer 15 may include a plurality of layers in the same manner as resist layer 13.

In board 10 configured in the above manner, CEM-3 is used for resin substrate 11 in this embodiment. Specifically, for board 10, a double-sided board obtained by forming metal layers 12 and 14, which comprise copper foil, on opposite sides of resin substrate 11.

Furthermore, the shape of board 10 (resin substrate 11) is not particularly limited, and the plan view shape of board 10 is, for example, a regular polygon such as an elongated rectangular shape or a square shape, or a circular shape, etc.

It should be noted that, although not illustrated, board 10 may include a connection terminal for receiving, from outside of LED module 1, direct current power for causing LED chip 20 to emit light. The connection terminal may either be a connector or a metal electrode, etc. In the case where the connection terminal is a metal electrode, however, at least part of the metal electrode is not covered by resist layer 13 and is exposed from resist layer 13.

[LED Chip]

LED chip 20 is an example of an LED element and is mounted above resin substrate 11. In this embodiment, LED chip 20 is directly mounted on board 10. Specifically, LED chip 20 is mounted on resist layer 13 via adhesive 40. More specifically, LED chip 20 is mounted on the top-most layer of resist layer 13 (in this embodiment, second layer 132).

LED chip 20 is a bare chip that emits visible light of a single color. As an example, LED chip 20 is a blue LED chip that emits blue light when energized, and is a gallium nitride (GaN)-based semiconductor element having a peak wavelength of from 440 nm to 470 nm. Furthermore, LED chip 20 is of a single-sided electrode structure in which both the p-side electrode and the n-side electrode are formed on the top surface of a nitride semiconductor layer formed on a sapphire substrate.

It should be noted that the number of LED chips 20 that are mounted on board 10 may be one or a plurality. Furthermore, when a plurality of LED chips 20 are mounted, the plurality of LED chips 20 may be arranged in a matrix or may be arranged in a single or a plurality of straight lines.

LED chip 20 is mounted on resist layer 13 using adhesive 40. Adhesive 40 is a die attach adhesive for mounting LED chip 20 onto board 10 by die-bonding. Adhesive 40 comprises, for example, an insulating resin material such as silicone resin, etc. In this embodiment, adhesive 40 is a white die attach adhesive. A white die attach adhesive can be made up of a white resin material comprising a resin material containing a white pigment (titanium oxide, silica, etc.). It should be noted that adhesive 40 may be transparent.

Furthermore, LED chip 20 is electrically connected to metal layer 12 by a pair of wires 50. Each of the pair of wires 50 electrically connects metal layer 12 and LED chip 20. In other words, LED chip 20 is electrically connected to metal layer 12 by wire bonding using the pair of wires 50.

The pair of wires 50 are connected to two metal layers 12 which are formed separated. Specifically, one of the pair of wires 50 is connected to one of two metal layers 12 which are formed separated, and the other of the pair of wires 50 is connected to the other of the two metal layers 12 which are formed separated. Furthermore, each wire 50 is, for example, a metal wire such as a gold wire, etc., but is not limited to such.

[Sealant]

Sealant 30 is a sealing material which seals LED chip 20. Sealant 30 comprises a wavelength-converting material which, when excited by the light emitted by LED chip 20, emits light of a wavelength different from the wavelength of the light of LED chip 20; and a light-transmissive material which contains the light-converting material.

As a light-transmissive material included in sealant 30, for example, it is possible to use a light-transmissive insulating resin material such as a silicone resin, an epoxy resin, or a fluorine-based resin. The light-transmissive material is not necessarily limited to an organic material such as a resin material, and an inorganic material such as a low melting point glass or a sol-gel glass may be used.

Furthermore, the wavelength converting material included in sealant 30 is, for example, a phosphor. The phosphor, which has the light emitted by LED chip 20 as an excitation light, emits fluorescence when excited, and emits light of the desired color (wavelength).

In this embodiment, LED chip 20 is a blue LED chip, and thus in order to obtain white light, an yttrium aluminum garnet (YAG)-based yellow phosphor, for example, can be used as the phosphor. Accordingly, part of the blue light emitted by the blue LED chip is absorbed by the yellow phosphor and wavelength-converted into yellow light. In other words, the yellow phosphor is excited by the blue light of the blue LED chip and emits yellow light. A white light is generated as a combined light obtained through the mixing of the yellow light of the yellow phosphor and the blue light that is not absorbed by the yellow phosphors, and this white light is emitted from sealant 30.

It should be noted that, in order to enhance color rendering characteristics, sealant 30 may further contain a red phosphor. Furthermore, a light-diffusing material, such as silica, for enhancing light-diffusion characteristics, or a filler, etc. for suppressing the settling of the phosphor may be dispersed in sealant 30.

Sealant 30 according to this embodiment is a phosphor-containing resin in which a silicone resin is used as a light-transmissive material and a yellow phosphor is dispersed in the silicone resin. Sealant 30 is, for example, applied using a dispenser so as to cover LED chip 20 mounted on board 10.

When a plurality of LED chips 20 are mounted on board 10, sealant 30 may collectively seal the plurality of LED chips 20. In this case, sealant 30 may be formed in the shape of a line following the layout of LED chips 20, or may be formed in a planar shape to cover all of the plurality of LED chips 20. The linear sealant 30 is, for example, an approximately cylindrical body. The planar sealant 30 is a lamellar body having a circular or rectangular plan view shape and an approximately constant thickness.

[Characteristics of LED Module]

Next, a configuration which is a characteristic of LED module 1 according to this embodiment will be described.

As illustrated in (a) in FIG. 1, in first region A1 which is a region in which LED chip 20 is mounted, resist layer 13 is formed on resin substrate 11 and LED chip 20 is mounted on resist layer 13 via adhesive 40. First region A1 indicates the region of the structure around LED chip 20 of LED module 1 in a section view.

Specifically, in first region A1, resist layer 13 (first layer 131, second layer 132), adhesive 40, and LED chip 20 are stacked above resin substrate 11 in this order. In other words, in first region A1, resin substrate 11 and resist layer 13 are directly connected, and metal layer 12 is not formed between resin substrate 11 and resist layer 13 below LED chip 20.

As illustrated in (c) in FIG. 1, in this embodiment, the entirety of LED chip 20 does not overlap with metal layer 12 in a plan view. Specifically, metal layer 12 has opening 12a, and LED chip 20 overlaps with opening 12a of metal layer 12 in a plan view. Specifically, in a plan view, opening 12a of metal layer 12 is formed into such a shape that LED chip 20 and metal layer 12 do not overlap. The plan view shape of opening 12a is, for example, circular, centered on LED chip 20.

On the other hand, as illustrated in (a) in FIG. 1, in second region A2 which is the region of the connection portion at which wire 50 and metal layer 12 are connected and the periphery of the connection portion, metal layer 12 is formed on resin substrate 11 and resist layer 13 is formed on metal layer 12. Second region A2 indicates the region of the connection portion at which wire 50 and metal layer 12 are connected and the surrounding structure in LED module 1 in a section view.

In second region A2, resist layer 13 has opening 13a exposing metal layer 12. Opening 13a includes first opening 131a formed in first layer 131, and second opening 132a formed in second layer 132. In the portion of second region A2 in which opening 13a is formed, only metal layer 12, out of metal layer 12 and resist layer 13, is formed on resin substrate 11.

In second region A2, wire 50 is electrically connected to metal layer 12 via opening 13a of resist layer 13. In this embodiment, plating layer 60 is formed on the surface of metal layer 12 which is exposed from opening 13a. Therefore, wire 50 is directly connected to plating layer 60, and electrically connected to metal layer 12 via plating layer 60. Plating layer 60 functions as a bonding pad during wire bonding. Plating layer 60 has a three-layered structure of nickel (Ni), palladium (Pd), and gold (Au).

Furthermore, in the outer peripheral portion of opening 13a in second region A2, metal layer 12 and resist layer 13 are formed above resin substrate 11. In second region A2, resist layer 13 in the outer peripheral portion of opening 13a is only a single layer. Specifically, in the outer peripheral portion of opening 13a of resist layer 13, only first layer 131 out of the plurality of layers of resist layer 13 is formed. In other words, as illustrated in (a) and (b) in FIG. 1, the aperture area of second opening 132 is bigger than the aperture area of first opening 131a. In this embodiment, the plan view shape of each of first opening 131a and second opening 132a is circular, centered on the connection portion between wire 50 and metal layer 12, and the diameter of second opening 132a is bigger than the diameter of first opening 131a.

[Advantageous Effects]

Figure 2:
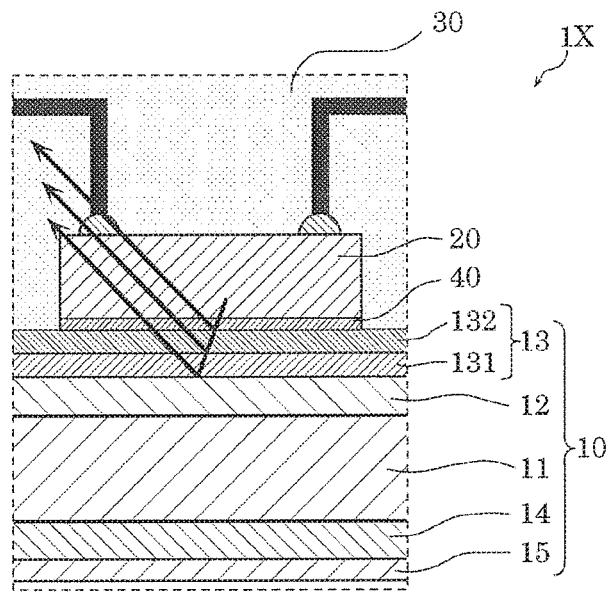
FIG. 2 is a cross-sectional view of the structure around an LED chip of an LED module in a comparative example.
Figure 3:
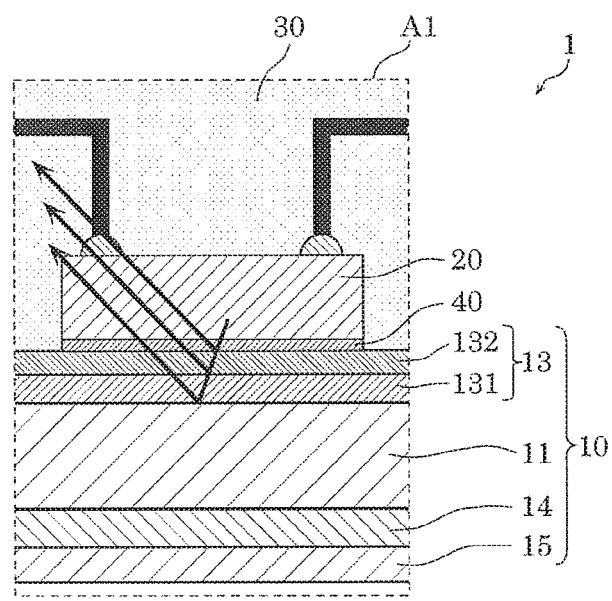
FIG. 3 is a cross-sectional view of the structure surrounding an LED chip of the LED module in the embodiment.

Next, the advantageous effects of LED module 1 according to this embodiment will be described using FIG. 2 and FIG. 3. FIG. 2 is a cross-sectional view of the structure around LED chip 20 in LED module 1X of a comparative example. FIG. 3 is a cross-sectional view of the structure around LED chip 20 in LED module 1 according to this embodiment, and corresponds to first region A1 in (a) in FIG. 1.

As illustrated in FIG. 2, in LED module 1X of the comparative example, metal layer 12 is formed below LED chip 20. Specifically, in the cross-sectional structure of the region below LED chip 20 in LED module 1X of the comparative example, metal layer 12, resist layer 13 (first layer 131, second layer 132), adhesive 40, and LED chip 20 are stacked above resin substrate 11 in this order.

In this case, since moisture or gas (oxygen, etc.) passes through resist layer 13 comprising a resin material, the moisture or gas that has passed through resist layer 13 causes metal layer 12 which is the underlying layer of resist layer 13 to degenerate. In particular, since moisture or gas easily passes through an epoxy acrylic-based resin material, degeneration of metal layer 12 becomes prominent when a white resist layer 13 is formed using an epoxy acrylic-based resin material. For example, when metal layer 12 is formed using copper, the moisture or gas that has passed through resist layer 13 causes the copper to degenerate, and thus the surrounding region directly below LED chip 20 looks reddish brown. In particular, when adhesive 40 is transparent, degeneration of metal layer 12 becomes more visibly prominent.

The color of metal layer 12 (copper layer), which is the underlying layer, can be seen via resist layer 13 in this manner because the peak wavelength of the optical reflectivity of white resist layer 13 is present near 450 nm, and the red component of visible light passes through resist layer 13.

In this manner, when metal layer 12 degenerates, the reflectivity of board 10X deteriorates, and the lumen maintenance factor of LED module 1X deteriorates.

In contrast, as illustrated in FIG. 3, with regard to LED module 1 according to this embodiment, in first region A1 in which LED chip 20 is mounted, metal layer 12 is not formed below LED chip 20. Specifically, in first region A1, resist layer 13, adhesive 40, and LED chip 20 are stacked above resin substrate 11 in this order.

Meanwhile, in LED module 1 according to this embodiment, in second region A2 including the periphery of the connection between wire 50 and metal layer 12, metal layer 12 is formed as illustrated in (a) in FIG. 1. Specifically, in second region A2, metal layer 12 and resist layer 13 are stacked above resin substrate 11 in this order.

In this manner, in LED module 1 according to this embodiment, metal layer 12 is formed in second region A2 but metal layer 12 is not formed in first region A1. Accordingly, in first region A1, it is possible to reduce the area of metal layer 12 which is the main factor in optical reflectivity deterioration compared to second region A2. In this embodiment, metal layer 12 is not formed in first region A1, and thus the area of metal layer 12 in first region A1 is zero.

Accordingly, since deterioration of reflectivity of board 10 can be suppressed, the deterioration of the lumen maintenance factor of LED module 1 can be suppressed.

Furthermore, in this embodiment, the optical reflectivity of resin substrate 11 is, for example, greater than the optical reflectivity of metal layer 12 that has degenerated. By adopting the above-described configuration, the deterioration of the lumen maintenance factor of LED module 1 can be further suppressed. For example, by using CEM-3 for resin substrate 11 and copper foil for metal layer 12, the optical reflectivity of resin substrate 11 can be made greater than the optical reflectivity of metal layer 12 that has degenerated.

SUMMARY

As described above, LED module 1 according to this embodiment includes: resin substrate 11, metal layer 12 formed above resin substrate 11; resist layer 13 formed above resin substrate 11 and including a plurality of layers; LED chip 20 mounted above resin substrate 11; and wire 50 connecting metal layer 12 and LED chip 20. In addition, in first region A1 in which LED chip 20 is mounted, resist layer 13 is formed above resin substrate 11, and LED chip 20 is mounted above resist layer 13 via adhesive 40. On the other hand, in second region A2 around a connection portion of wire 50 and metal layer 12, metal layer 12 is formed above resin substrate 11, and resist layer 13 is formed above metal layer 12.

Accordingly, it is possible to suppress deterioration of lumen maintenance factor caused by degeneration of metal layer 12 below LED chip 20.

In addition, in LED module 1 according to this embodiment, resist layer 13 includes a plurality of layers.

Accordingly, even if residue such as scrap generated during processing of resin substrate 11 remains, the top-most surface of resist layer 13 can be flattened. In other words, if resist layer 13 were only a single layer, it would not be possible to absorb the unevenness caused by the residue, and the unevenness would remain in the top-most surface of resist layer 13. With multi-layered resist layer 13, it is possible to absorb the unevenness caused by the residue to flatten the top-most surface of resist layer 13. As a result, the mountability of LED chip 20 which is mounted on resist layer 13 can be improved, and thus LED module 1 having high reliability can be realized.

In addition, with a multi-layered resist layer 13, each layer can be given a different role. For example, by selecting a desired material for each of the plural layers, it is possible, for example, to ensure accuracy with first layer 131 while ensuring heat-resistance and light fastness with second layer 132. As a result, LED module 1 having even higher reliability can be realized.

Furthermore, in this embodiment, in first region A1, resin resist 11 and resist layer 13 are directly connected.

Accordingly, in first region A1, metal layer 12 is eliminated between resin resist 11 and resist layer 13. Therefore, LED module 1 capable of suppressing lumen maintenance factor deterioration can easily be realized.

Furthermore, in this embodiment, adhesive 40 is white.

Accordingly, since optical reflectivity of board 10 can be improved compared to when adhesive 40 is transparent, lumen maintenance factor deterioration can be further suppressed.

Furthermore, in this embodiment, in second region A2, resist layer 13 has opening 13a which exposes metal layer 12, and wire 50 is electrically connected to metal layer 12 via opening 13a.

Accordingly, wire 50 and metal layer 12 can be electrically connected via opening 13a of resist layer 13. In other words, the exposed portion of metal layer 12 in opening 13a functions as a part for supplying power to LED chip 20. Accordingly, power can be supplied from metal layer 12 to LED chip 20 via wire 50 while covering metal layer 12 using resist layer 13.

Furthermore, in this embodiment, resist layer 13 in the outer peripheral portion of opening 13a is only a single layer.

Accordingly, even if resist layer 13 were multi-layered, the thickness of resist layer 13 in the periphery of opening 13a can be reduced, and thus it is possible to prevent wire 50 from coming into contact with the edge portion of opening 13a of resist layer 13 during wire bonding. Accordingly, wire bonding can be performed easily.

Furthermore, in this embodiment, the entirety of LED chip 20 does not overlap with metal layer 12 in a plan view.

Accordingly, since metal layer 12 is eliminated from the entire region below LED chip 20, lumen maintenance factor deterioration can be further suppressed.

In this case, metal layer 12 may further include opening 12a, and LED chip 20 may overlap with opening 12a in a plan view.

Accordingly, metal layer below LED chip 20 can be eliminated while ensuring sufficient area for metal layer 12. Therefore, LED module 1 having small wire resistance can be realized while suppressing lumen maintenance factor deterioration.

Furthermore, in this embodiment, LED chip 20 has first LED region 20a that does not overlap with metal layer 12 and second LED region 20b that overlaps with metal layer 12 in a plan view.

Accordingly, it is possible to partially leave metal layer 12 below LED chip 20. As a result, heat generated by LED chip 20 can be efficiently dissipated to board 10. Therefore, LED module 1 capable of suppressing lumen maintenance factor deterioration while ensuring heat-dissipation can be realized.

In this case, metal layer 12 may include a plurality of openings 12a and metal portion 12b formed between the plurality of openings 12a, and first LED region 20a may overlap with the plurality of openings 12a and second LED region 20b may overlap with metal portion 12b in a plan view.

Accordingly, both ensuring heat-dissipation and suppressing lumen maintenance factor deterioration can be easily achieved.

Furthermore, in this embodiment, resist layer 13 comprises a resin material such as an epoxy acrylic-based resin material, etc.

Accordingly, even if resist layer 13 is formed using a resin material such as an epoxy acrylic-based resin material, etc. which is highly transmissive of moisture or gas, lumen maintenance factor deterioration caused by degeneration of metal layer 12 can be suppressed. Therefore, since a resin material such as an epoxy acrylic-based resin material, etc. having low cost and high versatility can be used as the material of resist layer 13, a low-cost LED module 1 can be realized.

Furthermore, in this embodiment, metal layer 12 comprises copper.

Accordingly, even if metal layer 12 is formed using copper which easily deteriorates due to moisture or gas, lumen maintenance factor deterioration caused by degeneration of metal layer 12 can be suppressed. Therefore, since copper which has low resistivity and excellent conductivity can be used as the material of metal layer 12, LED module 1 having excellent electrical performance can be realized.

Furthermore, in this embodiment, LED module 1 further includes sealant 30 which seals LED chip 20.

Accordingly, LED chip 20 can be protected. Furthermore, by including a wavelength converting material in sealant 30, wavelength conversion of the light emitted by LED chip 20 becomes possible and LED module 1 that emits a desired color of light can be realized.

MODIFICATION

Although the LED module according to the present disclosure has been described based on the foregoing embodiment thus far, the present disclosure is not limited to the exemplary embodiment.

Figure 4:
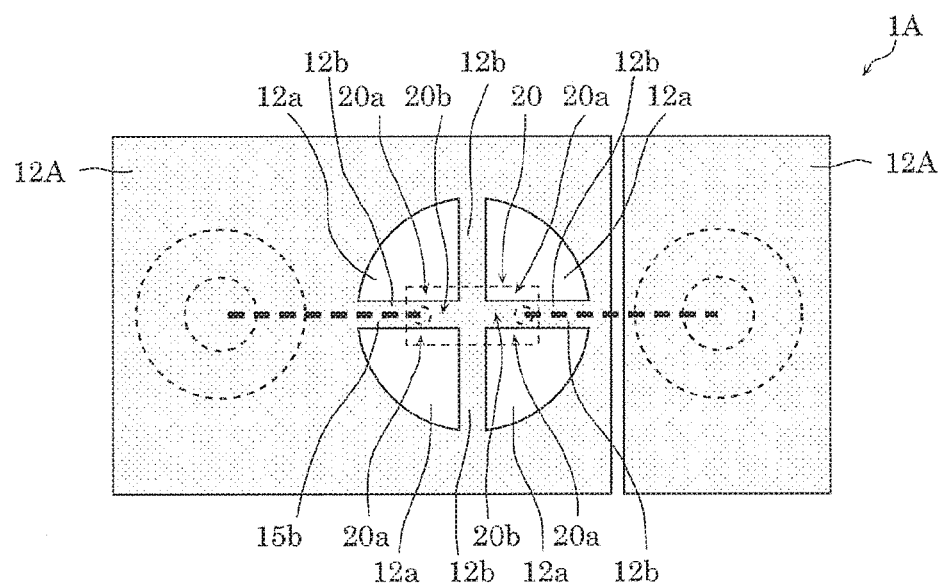
FIG. 4 is a diagram illustrating the plan view shape of a metal layer of an LED module according to modification 1.

For example, in the foregoing embodiment, the entirety of LED chip 20 does not overlap with metal layer 12, as illustrated in (c) in FIG. 1. However, without being limited to the above, LED chip 20 may partially overlap with metal layer 12A as illustrated in FIG. 4. Specifically, in a plan view, LED chip 20 includes first LED region 20a (non-overlapping region) which does not overlap with metal layer 12A and second LED region 20b (overlapping region) which overlaps with metal layer 12A. FIG. 4 is a diagram illustrating the plan view shape of metal layer 12A in LED module 1A according to Modification 1. Components other than metal layer 12A are the same as in LED module 1 according to the foregoing embodiment.

In this modification, as illustrated in FIG. 4, metal layer 12A includes a plurality of openings 12a and metal portion 12b formed between the plurality of openings 12a. In this case, in a plan view, first LED region 20a of LED chip 20 overlaps with the plurality of openings 12a, and second LED region 20b of LED chip 20 overlaps with metal portion 12b. It should be noted that although metal portion 12b is cross-shaped and the plurality of openings 12a are four fan-shaped openings, the shape of metal portion 12b and the plurality of openings 12a are not limited to these shapes.

Figure 5:
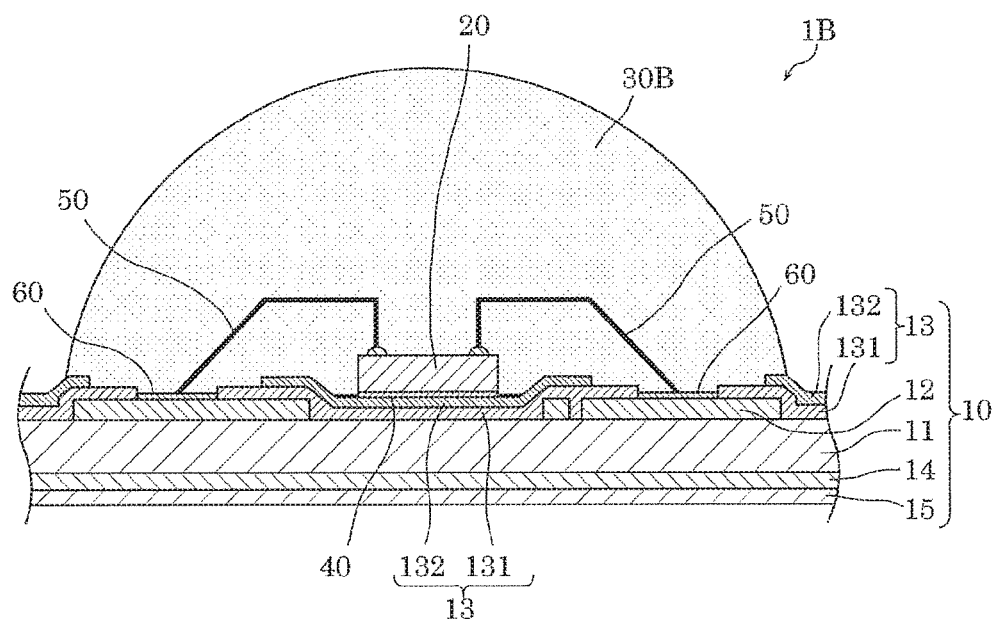
FIG. 5 is an enlarged partial cross-sectional view of an LED module according to modification 2.

Furthermore, although the case where sealant 30 collectively seals a plurality of LED chips 20 as illustrated in (a) in FIG. 1 is described in the foregoing embodiment, sealant 30 is not limited to this configuration. For example, sealant 30B may seal the plurality of LED chips 20 individually as illustrated in FIG. 5. In this case, a plurality of sealants 30B are formed, one for each LED chip 20, and the shape of each sealant 30B is approximately hemispherical. FIG. 5 is an enlarged partial cross-sectional view of LED module 1B according to Modification 2.

Furthermore, although resist layer 13 is two-layered in the foregoing embodiment, resist layer 13 is not limited to this configuration, and resist layer 13 may be multi-layered with three or more layers Furthermore, although LED module 1 is configured to emit white light by using a blue LED chip and a yellow phosphor in the foregoing embodiment, LED module 1 is not limited to such configuration. For example, LED module 1 may be configured to emit white light by using, in combination with the blue LEDs, a phosphor-containing resin that contains a red phosphor and a green phosphor. Furthermore, LED chips emitting light of a color other than blue may be used. Alternatively, white light may be generated by combining an ultraviolet light emitting LED chip which has a shorter wavelength than a blue LED chip, and respective phosphors emitting three primary colors (red, blue, green) when excited primarily by ultraviolet light.

Furthermore, in the foregoing embodiment a phosphor is used as a wavelength converting material, the wavelength converting material is not limited to such. For example, as a wavelength converting material, it is possible to use a material including a substance which absorbs light of a certain wavelength and emits light of a wavelength different to that of the absorbed light, such as a semiconductor, a metal complex, an organic dye, or a pigment.

Furthermore, although LED module 1 is configured to emit white light in the foregoing embodiment, LED module 1 is not limited to this configuration. For example, LED module 1 may be configured to emit a colored light in the visible light region.

Furthermore, LED module 1 according to the foregoing embodiment can be used as an illumination light source of a luminaire (lighting device) such as a downlight, a spotlight, or a base light. Aside from the above, LED module 1 may be used as a light source other than for lighting, such as a backlight light source of a liquid-crystal display device, etc., a lamp light source of a copier, etc., or a light source of a guide light or signboard device.

Forms obtained by various modifications to the exemplary embodiment that can be conceived by a person of skill in the art as well as forms realized by arbitrarily combining structural components and functions in the exemplary embodiment and modifications which are within the scope of the essence of the present disclosure are included in the present disclosure.

What is claimed is:

1. A light-emitting diode (LED) module, comprising:
   a substrate;
   a metal layer disposed above the substrate;
   a resist layer disposed above the substrate and including a plurality of layers;
   an LED chip mounted above the substrate; and
   a wire connecting the metal layer and the LED chip,
   wherein, in a first region in which the LED chip is mounted above the resist layer via an adhesive, the metal layer is not between the substrate and the resist layer, and
   in a second region which includes a connection at which the wire and the metal layer are connected and a periphery of the connection, the metal layer is disposed above the substrate, and the resist layer is disposed above the metal layer.

2. The LED module according to claim 1,
   wherein, in the second region:
   the resist layer includes an opening exposing the metal layer; and
   the wire is electrically connected to the metal layer via the opening.

3. The LED module according to claim 2,
   wherein a portion of the resist layer surrounding the opening includes only one layer of the plurality of layers.

4. The LED module according to claim 2,
   wherein the opening in the resist layer includes a first opening in a first layer of the plurality of layers and a second opening in a second layer of the plurality of layers, and
   an outer peripheral portion of the second opening includes the first layer.

5. The LED module according to claim 4,
   wherein a plan view shape of each of the first opening and the second opening is circular, and
   a diameter of the second opening is larger than a diameter of the first opening.

6. The LED module according to claim 2,
   wherein a thickness of the resist layer in a first portion surrounding the opening is reduced from a thickness of the resist layer in a second portion surrounding the first portion.

7. The LED module according to claim 2, further comprising:
   a plating layer disposed on a surface of the metal layer which is exposed by the opening,
   wherein the wire is electrically connected to the metal layer via the plating layer.

8. The LED module according to claim 1,
   wherein, in a plan view, an entirety of the LED chip does not overlap with the metal layer.

9. The LED module according to claim 8,
   wherein the metal layer includes an opening, and
   in the plan view, the LED chip overlaps with the opening.

10. The LED module according to claim 9,
    wherein a plan view shape of the opening in the metal layer is circular, and
    the LED chip is centered in the opening.

11. The LED module according to claim 1,
    wherein, in a plan view, the LED chip includes a first LED region which does not overlap with the metal layer and a second LED region which overlaps with the metal layer.

12. The LED module according to claim 11,
    wherein, in the first region, the metal layer includes a plurality of openings and a metal portion disposed between the plurality of openings, and
    in the plan view, the first LED region overlaps with the plurality of openings, and the second LED region overlaps with the metal portion.

13. The LED module according to claim 12,
    wherein the metal portion is cross-shaped, and
    each of the plurality of openings of the metal layer is fan-shaped.

14. The LED module according to claim 1,
    wherein the metal layer comprises copper.

15. The LED module according to claim 1, further comprising:
a sealant that seals the LED chip.

16. The LED module according to claim 15
wherein the sealant includes a wavelength-converting material and a light-transmissive material,
the wavelength-converting material, when excited by light emitted by the LED chip, emits light of a wavelength different from a wavelength of the light emitted by the LED chip, and
the light-transmissive material contains the wavelength-converting material.

17. The LED module according to claim 1,
wherein a first layer of the plurality of layers of the resist layer comprises a material configured to absorb unevenness in a top-most surface of the substrate, and
a second layer of the plurality of layers of the resist layer comprises a material configured to provide heat-resistance and light fastness.

18. A light-emitting diode (LED) module, comprising:
a substrate;
a metal layer disposed above the substrate;
a resist layer disposed above the substrate and including a plurality of layers;
an LED chip mounted above the substrate; and
a wire connecting the metal layer and the LED chip,
wherein, in a first region in which the LED chip is mounted, at least a portion of the resist layer is disposed directly on the substrate, and the LED chip is mounted above the resist layer via an adhesive that is white, and
in a second region which includes a connection at which the wire and the metal layer are connected and a periphery of the connection, the metal layer is disposed above the substrate, and the resist layer is disposed above the metal layer.

19. A light-emitting diode (LED) module, comprising:
a substrate;
a metal layer disposed above the substrate;
a resist layer comprising an epoxy acrylic based resin that is disposed above the substrate and including a plurality of layers;
an LED chip mounted above the substrate; and
a wire connecting the metal layer and the LED chip,
wherein, in a first region in which the LED chip is mounted, at least a portion of the resist layer is disposed directly on the substrate, and the LED chip is mounted above the resist layer via an adhesive, and
in a second region which includes a connection at which the wire and the metal layer are connected and a periphery of the connection, the metal layer is disposed above the substrate, and the resist layer is disposed above the metal layer.

* * * * *